(12) United States Patent
Hahs

(10) Patent No.: US 11,184,974 B2
(45) Date of Patent: Nov. 23, 2021

(54) OPERATING DEVICE AND HOUSEHOLD APPLIANCE HAVING THE OPERATING DEVICE

(71) Applicant: DIEHL AKO STIFTUNG & CO. KG, Wangen (DE)

(72) Inventor: Charles Hahs, Wroclaw (PL)

(73) Assignee: Diehl AKO Stiftung & Co. KG, Wangen (DE)

(*) Notice: Subject to any disclaimer, the term of this patent is extended or adjusted under 35 U.S.C. 154(b) by 0 days.

(21) Appl. No.: 17/024,980

(22) Filed: Sep. 18, 2020

(65) Prior Publication Data

US 2021/0092833 A1 Mar. 25, 2021

(30) Foreign Application Priority Data

Sep. 20, 2019 (DE) .............................. 102019006610
Jan. 22, 2020 (DE) .............................. 102020000357

(51) Int. Cl.
| | |
|---|---|
| *H05K 7/00* | (2006.01) |
| *G01D 5/347* | (2006.01) |
| *G05G 1/10* | (2006.01) |
| *H01H 19/00* | (2006.01) |
| *H01H 19/02* | (2006.01) |
| *H05K 1/02* | (2006.01) |

(52) U.S. Cl.
CPC ........... *H05K 1/0272* (2013.01); *G05G 1/105* (2013.01)

(58) Field of Classification Search
CPC ........ H05K 1/0272; H05K 7/00; G01D 5/347; G05G 1/10; G05G 1/105

USPC ................. 361/756; 248/224.7; 250/231.13; 362/23.01, 23.19, 231, 249.02, 551
See application file for complete search history.

(56) References Cited

U.S. PATENT DOCUMENTS

| | | | |
|---|---|---|---|
| 4,807,091 A * | 2/1989 | Obata .................... | G05G 1/105 362/23.19 |
| 10,330,324 B2 * | 6/2019 | Bach ........................ | F21V 5/04 |
| 10,890,331 B2 * | 1/2021 | Kim ....................... | F24C 7/082 |
| 2005/0284741 A1 * | 12/2005 | Suzuki ................ | H01H 19/025 200/310 |

(Continued)

FOREIGN PATENT DOCUMENTS

| | | |
|---|---|---|
| DE | 3816928 A1 | 12/1988 |
| EP | 2343718 A2 | 7/2011 |

*Primary Examiner* — Xiaoliang Chen
(74) *Attorney, Agent, or Firm* — Laurence A. Greenberg; Werner H. Stemer; Ralph E. Locher

(57) ABSTRACT

An operating device contains a cover plate having an opening, a rotatable operating element having an operating head on the cover plate, and a shaft running through the opening. Behind the cover plate and at a distance therefrom, there is a circuit board having an opening through which the shaft extends. The operating device includes a tube element which has a hollow-cylindrical base body that runs, between the cover plate and the shaft of the operating element, at least partially through the opening of the cover plate, and a radial inner side that forms, between the tube element and the shaft of the operating element, an inner flow channel that runs through the opening of the cover plate and past the opening of the circuit board, to protect the circuit board against extraneous substances which may enter the operating device through the opening of the cover plate.

11 Claims, 2 Drawing Sheets

(56) References Cited

U.S. PATENT DOCUMENTS

| | | | |
|---|---|---|---|
| 2012/0012721 A1* | 1/2012 | Baier | H01H 19/025 |
| | | | 248/224.7 |
| 2013/0146755 A1* | 6/2013 | Wagner | G01B 11/00 |
| | | | 250/231.13 |
| 2014/0056022 A1* | 2/2014 | Camli | G05G 1/10 |
| | | | 362/551 |
| 2016/0079013 A1* | 3/2016 | Levay | B60K 37/06 |
| | | | 200/316 |
| 2018/0010932 A1* | 1/2018 | Bach | F24C 7/082 |

* cited by examiner

OPERATING DEVICE AND HOUSEHOLD APPLIANCE HAVING THE OPERATING DEVICE

CROSS-REFERENCE TO RELATED APPLICATION

This application claims the priority, under 35 U.S.C. § 119, of German patent applications DE 10 2019 006 610, filed Sep. 20, 2019 and DE 10 2020 000 357, filed Jan. 22, 2020; the prior applications are herewith incorporated by reference in their entirety.

BACKGROUND OF THE INVENTION

Field of the Invention

The present invention relates to an operating device, in particular to an operating device containing a rotatable operating element, and in particular for an electronic household appliance.

In the case of such operating devices, there are embodiments on the market in which the rotatable operating element contains an operating head on the user side of the cover plate and a shaft which is connected to the operating head, the shaft extending through an opening in the cover plate into the interior of the operating device, and in which a circuit board is arranged behind the cover plate. A critical aspect of such designs is possible ingress of extraneous substances, for example water, cleaning liquids, dust, dirt, etc., through the opening of the cover plate into the interior of the operating device, for example during a cleaning process, which may cause possible damage to the circuit board or its fitted components. This risk is even greater in embodiments in which the user can remove the operating head from the shaft of the operating element, so that a sealing element between the shaft and the cover plate is often removed as well.

BRIEF SUMMARY OF THE INVENTION

The object of the invention is to provide an improved operating device having a rotatable operating element, which ensures reliable protection of the circuit board arranged behind the cover plate against extraneous substances entering.

This object is achieved by an operating device having the features of the independent claim. The dependent claims relate to particularly advantageous configurations and refinements of the invention.

The operating device according to the invention has a cover plate having a user side facing towards a user and an inner side facing away from a user, as well as an opening. An operating element is provided and has an operating head on the user side of the cover plate and with a shaft, which is connected to the operating head and extends through the opening of the cover plate. The operating element is rotatable about a longitudinal axis relative to the cover plate. A circuit board is arranged on the inner side of the cover plate, at a distance from the cover plate, and has an opening, in which case the shaft of the operating element (in the case of a corresponding length) may also extend through the opening of the circuit board. The operating device according to the invention furthermore contains a tube element which has a hollow-cylindrical base body that runs, between the cover plate and the shaft of the operating element, at least partially through the opening of the cover plate, and a radial inner side that forms, between the tube element and the shaft of the operating element, an inner flow channel that runs through the opening of the cover plate and past the circuit board through the opening of the circuit board.

That is to say, according to the invention, for an operating device having a rotatable operating element, the installation of an additional tube element is proposed, which—together with the opening in the circuit board—protects the circuit board and its fitted components against extraneous substances (for example water, cleaning liquids, dust, dirt, etc.) which may enter the operating device through the opening in the cover plate, by the tube element with its hollow-cylindrical base body forming an inner flow channel from the opening in the cover plate to the opening in the circuit board, so that extraneous substances entering the opening of the cover plate are guided through the opening of the circuit board, and therefore past the circuit board, further into the interior of the operating device without impinging on the circuit board and damaging it and its fitted components. By the use of such a tube element, the object mentioned in the introduction may be achieved with a single component in the operating device and it is possible to provide an operating device having a simple structure, which can be manufactured simply and economically.

The substantially hollow-cylindrically formed tube element is preferably configured to be waterproof (for example by material selection or coatings or (film) coverings of the outer walls), so that no liquids penetrate through the tube element and can in this way impinge on the circuit board. The tube element is, for example, formed from a plastic material.

In one configuration of the invention, the tube element furthermore contains, on its radial inner side, an extension that protrudes into the opening of the circuit board. That is to say, the extension of the tube element also covers the inner edge of the opening of the circuit board, so that liquids flowing through the inner flow channel cannot impinge on the circuit board with even greater reliability. As an alternative or in addition, for the same purpose the radial inner side of the tube element may be closer in the radial direction to the shaft of the operating element than the inner edge of the opening of the circuit board is, that is to say in other words the inner radius of the hollow-cylindrical tube element may be less than the radius of the opening of the circuit board.

Preferably, the tube element also contains a radial outer side that forms, between the tube element and the cover plate, an outer flow channel that runs through the opening of the cover plate. In this case, the circuit board is preferably isolated from the outer flow channel by at least one separating element.

In one embodiment variant of the invention, the at least one separating element contains a sealing element that is arranged in the opening of the cover plate, between the cover plate and the tube element, in order to close the outer flow channel. That is to say, the sealing element prevents ingress of extraneous substances through the outer flow channel, between the tube element and the cover plate, into the interior of the operating device. The fact that the sealing element is inserted not between the operating element and the tube element or between the operating element and the cover plate, but between the tube element and the cover plate, furthermore prevents the sealing element from being removed from the opening of the cover plate when the operating head is released from the shaft of the operating element. Since the sealing element reliably remains between the tube element and the cover plate in the opening, the protection of the circuit board against extraneous substances entering is ensured even more reliably. As an alternative or in addition, the at least one separating element may comprise a covering plate that extends, between the cover plate and the circuit board, away from the radial outer side of the tube element over the circuit board in order to cover the circuit board from the outer flow channel. That is to say, in the event of an open outer flow channel, extraneous substances entering are guided past the circuit board by the covering plate. The covering plate is, for example, annularly configured. The covering plate may preferably be formed integrally with the tube element and may thus be a constituent part of the tube element, or it may be fastened in a liquid-tight fashion as a separate element on the tube element.

In an application in which the operating element furthermore contains at least one light source (for example a light-emitting diode), which is mounted on the circuit board, in order to provide a rotatable and illuminable operating device, the tube element is preferably configured as a light guiding element having a light entry region facing towards the at least one light source and a light exit region facing towards the operating head of the operating element. That is to say, in this configuration variant of the invention the use of a light guiding element with a double function for an operating device having a rotatable and illuminable operating element is proposed. The first function of the light guiding element is to guide the light emitted by the at least one light source on the circuit board to the operating head of the rotatable operating element, by the light from the light source entering the light guiding element at the light entry region and emerging towards the operating head at the light exit region. The second function of the light guiding element is, as described above with reference to the general tube element, together with the opening in the circuit board to protect the circuit board and its fitted components against extraneous substances which may enter the operating device through the opening in the cover plate, by the light guiding element forming, with its hollow-cylindrical base body, an inner flow channel from the opening in the cover plate to the opening in the circuit board, so that extraneous substances entering the opening of the cover plate are guided through the opening of the circuit board, and therefore past the circuit board, further into the interior of the operating device without impinging on the circuit board and damaging it and its fitted components. By the use of a light guiding element with this double function, both the guiding of the light from the at least one light source on the circuit board to the operating head and the protection of the circuit board against extraneous substances entering the interior of the operating device may be achieved with only one component in the operating device, and an expedient and functionally reliable operating device having a simple structure, which can be manufactured simply and economically, may thus be provided.

The substantially hollow-cylindrically configured light guiding element is preferably formed from a transparent plastic material (for example PC or PMMA). Furthermore, the circumferential walls of the light guide are preferably configured to be non-transparent and/or reflective, for example by means of coatings, applied film coverings, special material selection and/or special surface structuring, in order to achieve light guiding with the least possible losses through the light guiding element. The light guiding element is preferably also configured to be waterproof (for example by coatings or (film) coverings of the outer walls), so that no liquids can penetrate through the light guiding element and thereby impinge on the circuit board.

In the configuration variant of the invention mentioned last, the operating head of the operating element preferably comprises at least one transparent region, through which light emerging from the light exit region of the light guiding element can pass. The transparent region of the operating head may preferably be formed by using a transparent material, by a hole running through the operating head, by a recess at the edge of the operating head and/or by a distance between the operating head and the cover plate.

In one configuration of the invention, the operating head may be fastened releasably on the shaft of the operating element. In this way, a process of cleaning the operating device, or an operating panel containing the operating device, may be made easier for the user. Because of the special tube element or light guiding element used according to the invention, such removal of the operating head does not entail any risk for the circuit board due to extraneous substances entering. The releasable fastening may, for example, be configured in the form of a clamp connection.

In one configuration of the invention, the operating device furthermore contains a rotation detection device which is configured to detect a rotational movement of the operating element, and/or a control element on which a rotational movement of the operating element acts, in/on the end region, facing away from the operating head, of the shaft of the operating element.

In another configuration of the invention, the operating device furthermore contains a sensor device for detecting a rotational movement of the operating element. The sensor device contains an encoding plate which is connected in a rotationally fixed fashion to the shaft of the operating element and extends on the lower side, facing away from the cover plate, of the circuit board, at a distance from the circuit board, at least partially along the circuit board and is provided with encoding on its side facing towards the circuit board. A sensor element is provided on the lower side, facing away from the cover plate, of the circuit board in order to detect the encoding. The encoding plate of the sensor device contains at least one opening in its edge region facing towards the shaft of the operating element. The opening of the encoding plate ensures that extraneous substances entering the operating device through the inner flow channel can travel further into the interior of the operating device after passing through the opening of the circuit board, without being diverted by the encoding plate towards the circuit board and towards the sensor device. The encoding and the corresponding sensor element may be configured for an optical, electronic, capacitive or other measuring system. By rotation of the operating element, the encoding is displaced along the circumferential direction, this being detected by the stationary sensor element in order preferably to detect a rotational movement or rotational setting of the operating element on the basis of the measurement signals.

The invention also relates to an electronic household appliance (for example a hob, cooking appliance, dishwasher, laundry treatment appliance, refrigerator and/or freezer and the like) having at least one above-described operating device of the invention.

Other features which are considered as characteristic for the invention are set forth in the appended claims.

Although the invention is illustrated and described herein as embodied in an operating device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
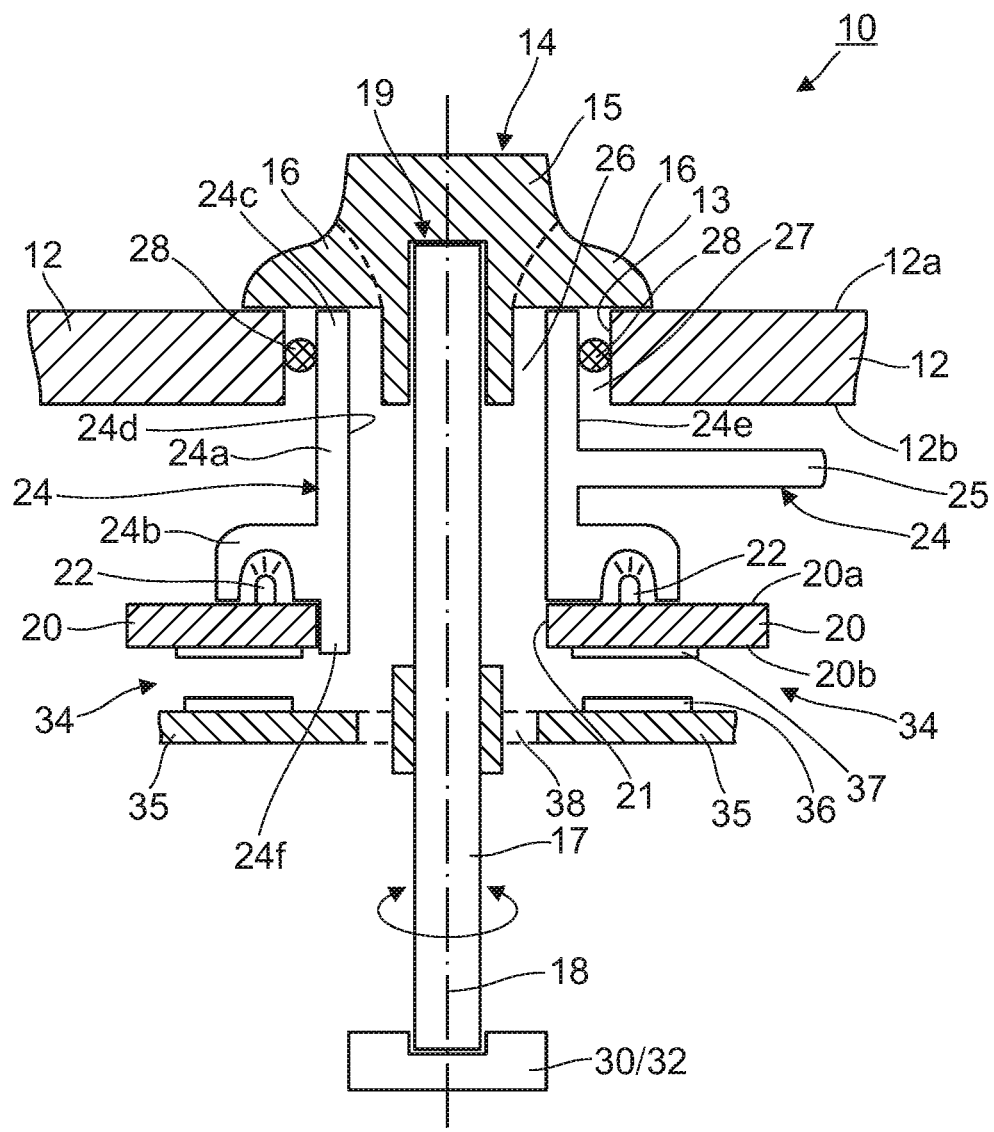
FIG. 1 is a diagrammatic, sectional view of an operating device according to one exemplary embodiment of the present invention.

Referring now to the figures of the drawings in detail and first, particularly to FIG. 1 thereof, there is shown by way of example a structure of one exemplary embodiment of an operating device according to the invention, including different optional embodiment variants.

The operating device 10 may, for example, be used in an electronic household appliance, for example a hob, a cooking appliance (for example an oven, grill, microwave oven), a dishwasher, a laundry treatment appliance (for example a washing machine, laundry dryer), a refrigerator and/or a freezer or the like.

The operating device 10 has a cover plate 12, which may in principle be made from any desired material (for example plastic, metal, glass, glass-ceramic, etc.). The cover plate 12 has a user side 12a (above in FIG. 1) facing towards a user and an inner side 12b (below in FIG. 1) facing away from a user. The cover plate 12 furthermore has an opening 13 for inserting an operating element 14. The operating element 14 consists essentially of an operating head 15, which is positioned on the user side 12a of the cover plate 12 in order to be accessible to a user of the operating device 10, and a shaft 17 which is connected in a rotationally fixed fashion to the operating head 15. The operating head 15 is for example connected to the shaft 17 by means of a clamp connection 19, and can thus be released from the shaft 12 by the user. The operating element 14 is rotatable relative to the cover plate 12 about a rotation axis 18, which corresponds to the longitudinal axis of the shaft 17 and runs substantially perpendicularly to the plane of the cover plate 12. The operating head 15 is, for example, formed from a plastic material.

A circuit board 20 is arranged on the inner side 12b of the cover plate 12 and at a distance from the cover plate 12. The circuit board 20 is preferably oriented substantially parallel to the cover plate 12. The circuit board 20 has an upper side 20a (above in FIG. 1) facing towards the cover plate 12 and a lower side 20b (below in FIG. 1) facing away from the cover plate 12. The circuit board 20 furthermore has an opening 21 which is positioned, in relation to the rotation axis 18 of the operating element 14, substantially concentrically with the opening 13 of the cover plate 12. The opening 13 of the cover plate 12 and the opening 21 of the circuit board 20 may optionally be dimensioned in the same way or differently.

Mounted on the circuit board 20 in this exemplary embodiment, there are one or more light sources 22 (for example light-emitting diodes) by which the operating head 15 of the operating element 14 can be illuminated in order to show the user the position of the operating head 15 and/or inform him or her of an operating state of the operating device 10 or, for example, of an unit of the household appliance. Furthermore—depending on the application and depending on the embodiment—further electronic elements, control circuits, sensor systems and the like may be mounted on the circuit board.

As illustrated in FIG. 1, the shaft 17 of the operating element 14 extends, starting from the operating head 15, through the opening 13 of the cover plate 12 and, in this exemplary embodiment, also through the opening 21 of the circuit board 20 and further into the interior of the operating device 10 (downwards in FIG. 1). Optionally, a rotation detection device 30 for detecting a rotational movement of the operating element 14, or a controller element 32 on which a rotational movement of the operating element 14 acts, is provided in/on the lower end region of the shaft 17 of the operating element 14.

According to the invention, the operating device 10 furthermore contains a special tube element 24, in this exemplary embodiment a special light guiding element 24 with a double function. The light guiding element 24 is intended on the one hand to guide the light emitted by the light sources 22 to the operating head 15 of the operating element 14 and, on the other hand, to protect the circuit board 20 against extraneous substances such as water, cleaning liquids, dust, dirt, etc., which may enter the operating device 10 through the opening 13 in the cover plate 12, for example during cleaning of the operating device 10.

To this end, the light guiding element 24 comprises a substantially hollow-cylindrical or tubular base body 24a, which is arranged (and optionally fastened) on the circuit board 20 substantially concentrically with the rotation axis 18 of the operating element 14. The light guiding element 24 furthermore has a light entry region 24b, which faces towards the light sources 22 on the circuit board 20 so that the light emitted by the light sources 22 can enter the light guiding element 24. The light guiding element 24 furthermore has a light exit region 24c, which faces towards at least one transparent region 16 of the operating head 15 of the operating element 14 so that the light passing through the light guiding element 24 can emerge in the transparent region 16 and be visible to the user of the operating device 10. The at least one transparent region 16 of the operating head 15 is, for example, formed by a transparent material in the operating head, a hole running through the operating head, a recess at the edge of the operating head and/or a distance between the operating head and the cover plate. The light guiding element 24 furthermore has a radial inner side 24d and a radial outer side 24e.

As illustrated in FIG. 1, the lower section, which contains the light entry region 24b, of the light guiding element 24 is in contact with the circuit board 20. The upper section, which contains the light exit region 24c, protrudes between the cover plate 12 and the shaft 17 of the operating element 14 over a part or over the entire thickness of the cover plate 12 into the opening 13 of the cover plate 12. In one embodiment variant (right partial image of FIG. 1), the inner radius of the light guiding element 24 is somewhat less than the radius of the opening 21 of the circuit board 20, so that the radial inner side 24d of the light guiding element 24 protrudes beyond the circuit board 20 in the direction of the opening 21. In another embodiment variant (left partial image of FIG. 1), on its lower section the light guiding element 24 contains an extension 24f, which protrudes at least partially into the opening 21 of the circuit board 20 or protrudes through the opening 21 and therefore covers the inner edge of the circuit board 20.

The light guiding element is on the one hand formed from a transparent plastic material, for example polycarbonate (PC) or polymethyl methacrylate (PMMA), and on the other hand, for example, is configured to be waterproof by suitable coatings or (film) coverings on the outer walls.

With this structure, the light guiding element 24 forms, on its radial inner side 24*d*, between the light guiding element 24 and the shaft 17 of the operating element 14, an inner flow channel 26 that runs through the opening 13 of the cover plate 12 and through the cavity of the light guiding element 24, and finally through the opening 21 of the circuit board 20, past the circuit board 20. Extraneous substances can thus flow through this inner flow channel 26 into the interior of the operating device 10 without reaching the circuit board 20. The circuit board 20 is therefore protected against damage by extraneous substances entering. This also applies in particular for the case in which the user removes the operating head 15 from the shaft 17.

Furthermore, with this structure, the light guiding element 24 forms on its radial outer side 24*e*, between the light guiding element 24 and the cover plate 12, an outer flow channel 27 that runs through the opening 13 of the cover plate 12. In order to protect the circuit board 20 against extraneous substances which enter the operating device 10 through this outer flow channel 27, in the exemplary embodiment of FIG. 1 a sealing element 28 is arranged in the opening 13 of the cover plate 12, between the cover plate 12 and the light guiding element 24, so that the outer flow channel 27 is isolated. Even when the user releases the operating head 15 from the shaft 17 of the operating element 14, this sealing element 28 still remains placed in the outer flow channel 27 since it has no contact with the operating head 15, as is generally the case in conventional operating devices.

As represented in the right partial image of FIG. 1, the light guiding element 24 may optionally furthermore be provided with a covering plate 25 which extends, in the region between the cover plate 12 and the circuit board 20, starting from the radial outer side 24*e* of the light guiding element 24 over the circuit board 20, and thus shields the circuit board 20 from the outer flow channel 27. In the embodiment variant containing this covering plate 25, the sealing element 28 in the outer flow channel 27 may optionally be omitted. The covering plate 25 is preferably an integral constituent part of the light guiding element 24. Since the covering plate 25 protrudes beyond the circuit board 20 in the radial direction, extraneous substances which, for example in an embodiment without a sealing element or in the case of an incompletely isolating sealing element 20, would flow through the opening 13 of the cover plate 12 into the outer flow channel 27, flow past the outer edge of the circuit board 20 further into the interior of the operating device 10.

In the exemplary embodiment of FIG. 1, light sources 22 are mounted on the circuit board 20 and the tube element 24 is therefore advantageously configured as a light guiding element. In other exemplary embodiments of the invention, particularly in exemplary embodiments without light sources 22 (as well as in the schematic sketches of FIGS. 2A-2C of the general structure), the tube element 24 may also be configured simply without a light guiding function. In this case, the structure of the tube element is provided, in principle in a similar way to FIG. 1, with a hollow-cylindrical base body 24, a radial inner side 24*d* for forming an inner flow channel 26, and a radial outer side 24*e* for forming an outer flow channel 27, and optionally a covering plate 25. The upper section of the tube element 24 extends, in a similar way to the light exit region 24*c*, into the opening 13 of the cover plate 12, and the lower section of the tube element 24 ends on the circuit board 20 or protrudes with an extension 24*f* into the opening 21 of the circuit board 20, although it is not necessary to fully adopt the shape of the light entry region 24*b* in order to cover the light sources 22. The material of the tube element 24 may in principle be any desired material, although the tube element 24 is preferably formed from a plastic material.

Figure 2A:
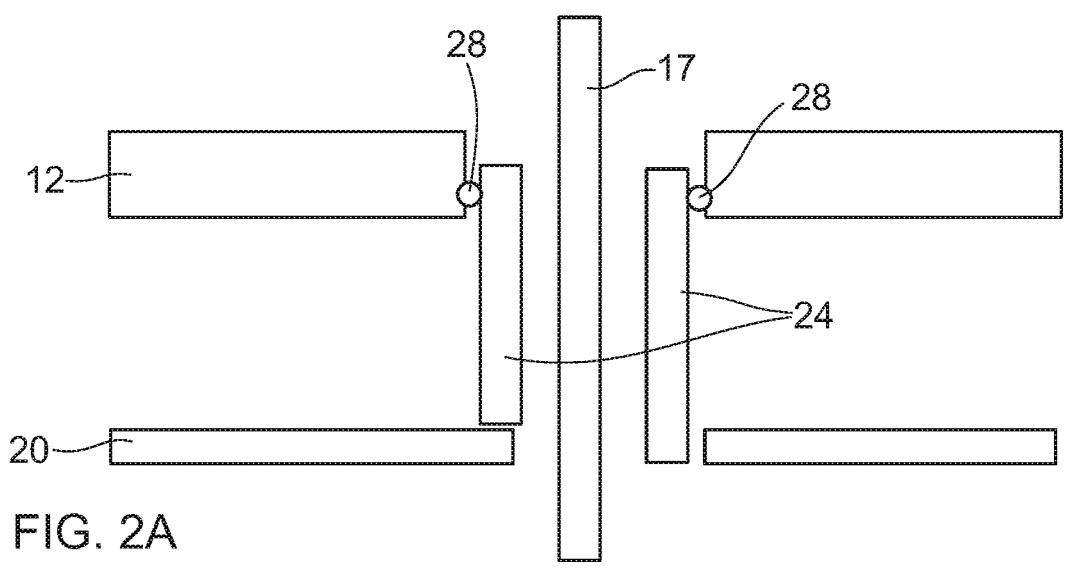
FIGS. 2A-2C show schematic sketches of different design variants of the operating device according to the invention.
Figure 2B:
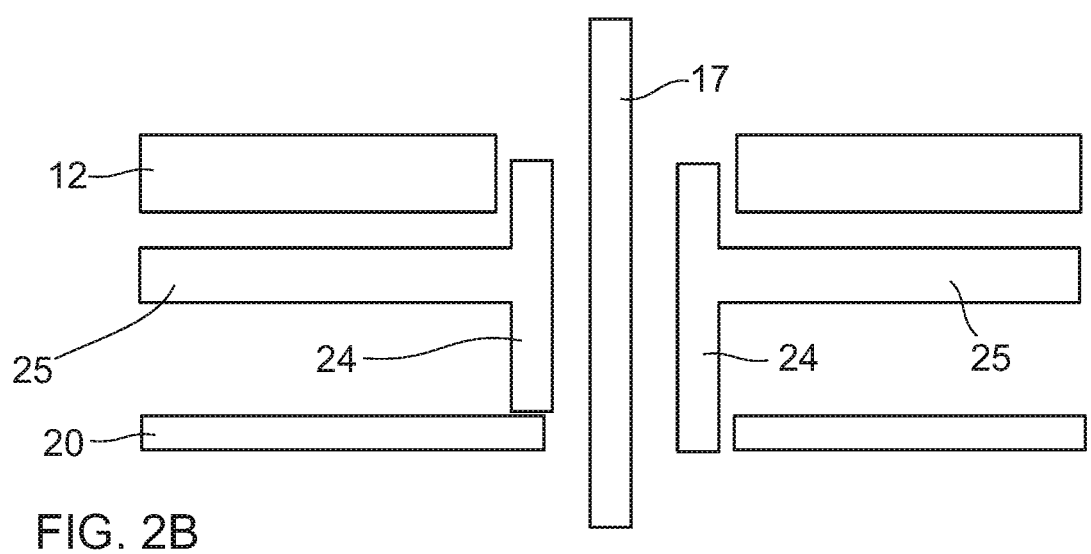

FIG. 2A shows, in abstract representation form, an embodiment variant in which only at least one sealing element 28 is provided in the opening 13 of the cover plate 12, between the tube element or light guiding element 24 and the cover plate 12. FIG. 2B shows, in abstract representation form, an embodiment variant in which only the covering plate 25 is provided on the tube element or light guiding element 24. As illustrated in FIG. 1, these two embodiment variants may also be combined with one another, i.e. both at least one sealing element 28 and the covering plate 25 may be provided.

In the exemplary embodiment of FIG. 1, the operating device 10 furthermore comprises a sensor device 34 for detecting a rotational movement of the operating element 14. As represented by way of example in FIG. 1, the sensor device 34 contains an encoding plate 35 which is connected in a rotationally fixed fashion to the shaft 17 of the operating element 14 and extends on the lower side 20*b*, facing away from the cover plate 12, of the circuit board 20, at a distance from the circuit board 20, at least partially along the circuit board 20. The encoding plate 35 is provided with encoding 36 on its side facing towards the circuit board 20. The encoding 36 may, for example, be configured optically (for example with reflectors) or electronically (for example with electrodes). The sensor device 34 furthermore has a sensor element for detecting the encoding 36 on the encoding plate 35, this sensor element being arranged on the lower side 20*b*, facing away from the cover plate 12, of the circuit board 20. The sensor element 37 functions according to the type of encoding 36, for example optically or electronically/capacitively. With the aid of the measurement signals of the sensor element 37, it is possible to determine a movement, a movement direction, a relative position and/or an absolute position of the encoding 36, which corresponds to a corresponding rotational movement or rotational setting of the operating element 14 relative to the cover plate 12.

In order to prevent extraneous substances, which flow through the inner flow channel 26 into the operating device 10, from being diverted by the encoding plate 35 of the sensor device 34 onto the lower side 20*b* of the circuit board 20, one or more openings 38, through which extraneous substances in the inner flow channel 26 can flow further along the shaft 17 into the operating device, are provided in the coding plate 35, close to the shaft 17 of the operating element 14.

Figure 2C:
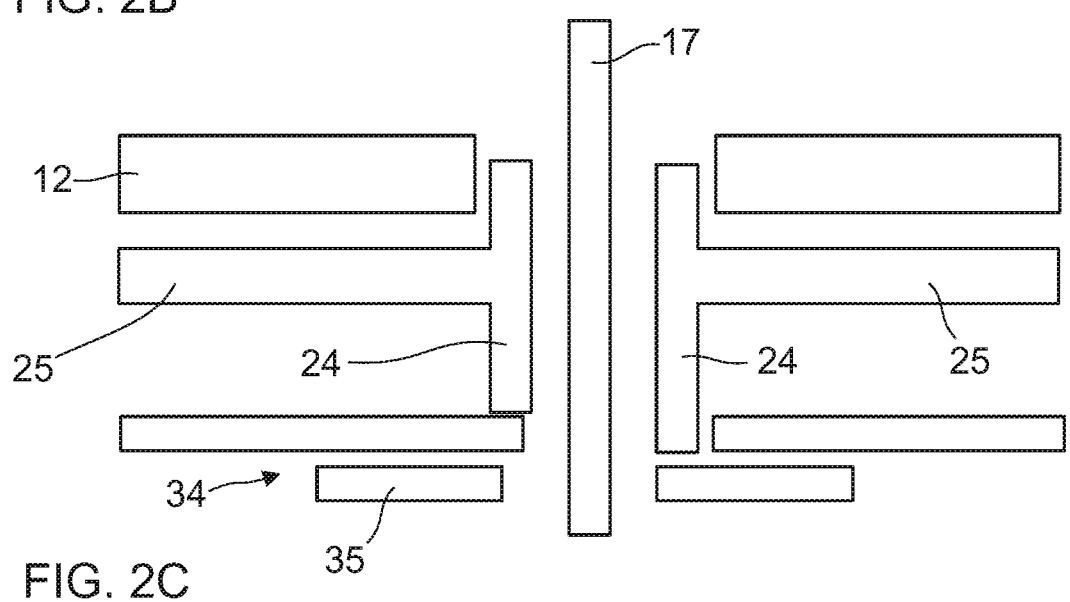

FIG. 2C shows, in abstract representation form, an embodiment variant having such an encoding plate 35. While in FIG. 2C the tube element or light guiding element 24 comprises a covering plate 25 in a similar way to FIG. 2B, the embodiment variant of FIG. 2C may alternatively also, in a similar way to FIG. 2A, be provided only with a sealing element 28 in the opening 13 of the cover plate 12, or it may additionally be provided with a sealing element 28 as in FIG. 2A.

The following is a summary list of reference numerals and the corresponding structure used in the above description of the invention:

10 operating device
12 cover plate
12a/12b user side/inner side
13 opening
14 operating element
15 operating head
16 transparent region
17 shaft
18 longitudinal axis/rotation axis
19 clamp connection
20 circuit board
20a/20b upper side/lower side
21 opening
22 light source
24 tube element, for example light guiding element
24a hollow-cylindrical base body
24b light entry region
24c light exit region
24d radial inner side
24e radial outer side
24f extension
25 covering plate
26 inner flow channel
27 outer flow channel
28 sealing element
30 rotation detection device
33 control element
34 sensor device
35 encoding plate
36 encoding
37 sensor element
38 opening

The invention claimed is:

1. An operating device, comprising:
a cover plate having a user side facing towards a user, an inner side facing away from the user, and an opening formed therein;
an operating element having an operating head disposed on said user side of said cover plate and a shaft connected to said operating head and extending through said opening of said cover plate, said operating element being rotatable about a longitudinal axis relative to said cover plate;
a circuit board disposed on said inner side of said cover plate, at a distance from said cover plate, and having an opening formed therein, in which case said shaft of said operating element may also extend through said opening of said circuit board; and
a tube element having a hollow-cylindrical base body running, between said cover plate and said shaft of said operating element, and at least partially through said opening of said cover plate, said tube element further having a radial inner side forming, between said tube element and said shaft of said operating element, an inner flow channel running through said opening of said cover plate and past said circuit board through said opening of said circuit board.

2. The operating device according to claim 1, wherein:
said tube element contains, on said radial inner side, an extension that protrudes into said opening of said circuit board; and/or
said radial inner side of said tube element is closer in a radial direction to said shaft of said operating element than an inner edge of said opening of said circuit board is.

3. The operating device according to claim 1, wherein said tube element contains a radial outer side that forms, between said tube element and said cover plate, an outer flow channel that runs through the opening of said cover plate; and
further comprising at least one separating element, said circuit board being isolated from said outer flow channel by said at least one separating element.

4. The operating device according to claim 3, wherein said at least one separating element contains a sealing element that is disposed in said opening of said cover plate, between said cover plate and said tube element, in order to close said outer flow channel.

5. The operating device according to claim 3, wherein said at least one separating element includes a covering plate that extends, between said cover plate and said circuit board, away from said radial outer side of said tube element over said circuit board in order to cover said circuit board from said outer flow channel.

6. The operating device according to claim 1, further comprising at least one light source mounted on said circuit board; and
said tube element is configured as a light guiding element having a light entry region facing towards said at least one light source and a light exit region facing towards said operating head of said operating element.

7. The operating device according to claim 6, wherein said operating head of said operating element contains at least one transparent region, through which light emerging from said light exit region of said light guiding element can pass.

8. The operating device according to claim 1, wherein said operating head is fastened releasably on said shaft of said operating element.

9. The operating device according to claim 1, which further comprises:
a rotation detector configured to detect a rotational movement of said operating element; and/or
a controller on which a rotational movement of said operating element acts, said rotation detector and/or said controller disposed in an end region, facing away from said operating head, of said shaft of said operating element.

10. The operating device according to claim 1, further comprising:
a sensor for detecting a rotational movement of said operating element, said sensor containing:
an encoding plate connected in a rotationally fixed fashion to said shaft of said operating element and extends on a lower side, facing away from said cover plate, of said circuit board, at a distance from said circuit board, at least partially along said circuit board and is provided with encoding on a side facing towards said circuit board; and
a sensor element disposed on said lower side, facing away from said cover plate, of said circuit board in order to detect said encoding; and
said encoding plate of said sensor having at least one opening formed therein in an edge region facing towards said shaft of said operating element.

11. An electronic household appliance, comprising:
an operating device according to claim 1.

* * * * *